United States Patent
Ormond et al.

(10) Patent No.: US 6,255,133 B1
(45) Date of Patent: *Jul. 3, 2001

(54) ELECTRO OPTICAL DEVICES WITH REDUCED FILTER THINNING ON THE EDGE PIXEL PHOTOSITES AND METHOD OF PRODUCING SAME

(75) Inventors: Brian T. Ormond, Webster; Josef E. Jedlicka, Rochester; Thomas Grimsley, Fairport; Paul A. Hosier, Rochester, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/641,292

(22) Filed: Aug. 18, 2000

Related U.S. Application Data

(62) Division of application No. 09/196,462, filed on Nov. 19, 1998, now Pat. No. 6,201,293.

(51) Int. Cl.$^7$ ............................................. H01L 21/302
(52) U.S. Cl. ................... 438/57; 438/81; 438/70; 438/75; 438/462
(58) Field of Search ..................... 438/57, 60, 65, 438/68, 70, 75, 73, 80, 81, 460, 462, 795; 257/225, 431, 432, 667, 233

(56) References Cited

U.S. PATENT DOCUMENTS

| | | |
|---|---|---|
| 4,315,978 | 2/1982 | Hartman ........................... 430/4 |
| 4,814,296 | 3/1989 | Jedlicka et al. ................... 437/226 |
| 5,153,421 | 10/1992 | Tandon et al. .................... 250/208.1 |
| 5,340,619 | 8/1994 | Chen et al. ....................... 424/498 |
| 5,473,513 | 12/1995 | Quinn ............................... 361/760 |
| 5,521,125 | 5/1996 | Ormond et al. .................. 437/227 |
| 5,530,278 | 6/1996 | Jedlicka et al. ................... 257/233 |
| 5,604,362 | 2/1997 | Jedlicka et al. ................... 257/233 |
| 5,848,331 | 12/1998 | Fromm ............................. 399/122 |
| 6,111,247 | 8/2000 | Sengupta ......................... 250/226 |

Primary Examiner—Savitri Mulpuri
(74) Attorney, Agent, or Firm—P. Daebeler

(57) ABSTRACT

The present invention relates to electro optical devices with a reduced filter thinning on the edge pixels and a method for reducing the thinning of filter layers on the pixels closest to the edge of an electro optical device such as a photosensitive chip, as would be used, for example, in a full-color digital copier or scanner. A semiconductor wafer includes a main surface defining a plurality of chip areas and tab regions separated by grooves, wherein the chip areas include inner photosites, outer photosites and bonding pads. A plurality of dams are deposited over the main surface in the tab regions, and a clear layer is deposited over the main surface exclusive of the bonding pads. Alternatively, a clear layer is deposited over the main surface exclusive of the bonding pads, and a plurality of tabs is then deposited in the tab regions on the main surface. A first primary color filter layer is deposited over at least first inner photosite and first outer photosite, and the first primary color filter layer transmits a primary color.

4 Claims, 6 Drawing Sheets

ELECTRO OPTICAL DEVICES WITH REDUCED FILTER THINNING ON THE EDGE PIXEL PHOTOSITES AND METHOD OF PRODUCING SAME

This application is a divisional of application Ser. No. 09/196,462, filed Nov. 19, 1998 now U.S. Pat. No. 6,201, 293.

Attention is directed to copending application Attorney Docket No. D/98036, U.S. patent application Ser. No. 09/196,441, filed Nov. 19, 1998, entitled, "ELECTRO OPTICAL DEVICES WITH REDUCED FILTER THINNING ON THE EDGE PIXEL PHOTSITES AND METHOD FOR PRODUCING SAME". The disclosure of this copending application is hereby incorporated by reference in its entirety.

FIELD OF THE INVENTION

The present invention relates to electro optical devices with a reduced filter thinning on the edge or outer pixel photosites and a method for reducing the thinning of filter layers on the pixel photosites closest to the edge of an electro optical device such as a photosensitive chip, as would be used, for example, in a full-color digital copier or scanner.

BACKGROUND OF THE INVENTION

Image sensors for scanning document images, such as charge coupled devices (CCDs), typically have a row or linear array of photosites together with suitable supporting circuitry integrated onto a semiconductor chip. Usually, a sensor is used to scan line by line across the width of a document with the document being moved or stepped lengthwise in synchronism therewith. A typical architecture for such a sensor array is given, for example, in U.S. Pat. No. 5,153,421.

In a full-page-width image scanner, there is provided a linear array of photosensors which extends the full width of an original document, such as eleven inches. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are assembled end-to-end to form a single linear array of photosensors as disclosed in U.S. Pat. No. 5,473,513. However, a single chip having a linear array may also be used for sensing images and converting those images into electrical signals to be output from each photosensor, which can be converted into a digital signal. These chips can also be assembled end to end to form a full width array comprising a multiple parallel linear arrays of photosites.

With the gradual introduction of color-capable products into the office equipment market, it has become desirable to provide scanning systems which are capable of converting light from full-color images into separate trains of image signals, each train representing one primary color. In order to obtain the separate signals relating to color separations in a full-color image, one technique is to provide on a semiconductor chip multiple parallel linear arrays of photosensors, each of the parallel arrays being sensitive to one primary color. Typically, this arrangement can be achieved by providing multiple linear arrays of photosensors which are physically identical except for a translucent primary-color overlay over the photosensitive areas, or "photosites," for that linear array. In other words, the linear array which is supposed to be sensitive to red light only will have a translucent red layer placed on the photosites thereof, and such would be the case for a blue-sensitive array and a green-sensitive array. As the chip is exposed to an original full-color image, only those portions of the image which correspond to particular primary colors wil reach those photosensors assigned to the primary color.

The most common substances for providing these translucent filter layers over the photosites is polyimide or acrylic. For example, polyimide is typically applied in liquid form to a batch of photosensor chips while the chips are still in undiced, wafer form. After the polyimide liquid is applied to the wafer, the wafer is centrifuged to provide an even layer of a particular polyimide. In order to obtain the polyimide having the desired primary-color-filtering properties, it is well known to dope the polyimide with either a pigment or dye of the desired color, and these dopants are readily commercially available. When it is desired to place different kinds of color filters on a single chip, a typical technique is to first apply an even layer of polyimide over the entire main surface of the chip (while the chip is still part of the wafer) and then remove the unnecessary parts of the filter by photo-etching or another well known technique. Typically, all of the filter layer placed over the chip is removed except for those areas over the desired set of photosites. Acrylic is applied to the wafer in a similar manner.

SUMMARY OF THE INVENTION

According to a first embodiment of the present invention, a semiconductor wafer includes a main surface defining a plurality of chip areas and tab regions separated by grooves, wherein the chip areas include inner photosites, outer photosites and bonding pads. A plurality of dams are deposited over the main surface in the tab regions, and a clear layer deposited over the main surface and dams exclusive of the bonding pads. A first primary color filter layer is deposited over at least first inner photosite and first outer photosite, wherein the first primary color filter layer transmits a primary color. A second primary color filter layer is deposited over at least a second inner photosite and a second outer photosite, wherein the second primary color filter layer transmits a second primary color. A third primary color filter layer is deposited over at least a third inner photosite and a third outer photosite, wherein the third primary color filter layer transmits a third primary color. The dams consist of aluminum, polyimide or acrylic, and the filter layers and the clear layer consist of polyimide or acrylic.

According to a second embodiment, a semiconductor wafer includes a main surface defining a plurality of chip areas and tab regions separated by grooves, wherein the chip areas include inner photosites, outer photosites and bonding pads, and wherein a clear layer is deposited on the main surface exclusive of the bonding pads. A plurality of dams are placed on the clear layer on the main surface in the tab regions, and a first primary color filter layer is deposited over at least first inner photosite and first outer photosite. The first primary color filter layer transmits a primary color. A second primary color filter layer is deposited over at least a second inner photosite and a second outer photosite, wherein the second primary color filter layer transmits a second primary color. A third primary color filter layer is deposited over at least a third inner photosite and a third outer photosite, wherein the third primary color filter layer transmits a third primary color. The dams consist of aluminum, polyimide or acrylic, and the filter layers and the clear layer consist of polyimide or acrylic.

A method for fabricating the photosensitive chips of the first embodiment comprises providing a semiconductor wafer having a main surface defining chip areas separated by V-grooves, the chip areas defining bonding pads and three rows of photosites, wherein the photosites include inner photosites, outer photosites and bonding pads; depositing dams in tab regions on the semiconductor wafer; hard baking the semiconductor wafer; depositing a clear layer on the semiconductor wafer; soft baking the semiconductor wafer; exposing selective areas of a semiconductor wafer; etching the clear layer covering the bonding pads from the semiconductor wafer; hard baking the semiconductor wafer; and depositing a first primary color filter layer over at least first inner photosite and first outer photosite, the first primary color filter transmitting a primary color. The method for fabricating the semiconductor chip further includes dicing the semiconductor wafer to produce the semiconductor chip for single chip applications or for assembly on a substrate to provide a full width array.

A method for fabricating the photosensitive chips of the second embodiment comprising providing a semiconductor wafer having a main surface defining chip areas separated by V-grooves, the chip areas defining bonding pads and three rows of photosites, wherein the photosites include inner photosites, outer photosites and bonding pads; depositing first clear layer on the semiconductor wafer; soft baking the semiconductor wafer; exposing selective areas of a semi-conductor wafer; etching the first clear layer covering the bonding pads from the semiconductor wafer; hard baking the semiconductor wafer; depositing dams in tab regions on the semiconductor wafer; hard baking the semiconductor wafer; and depositing a first primary color filter layer over at least first inner photosite and first outer photosite, the first primary color filter layer transmitting a primary color. The semiconductor wafer is diced to provide the semiconductor chip for single applications or for assembly on a substrate to provide a full width array.

DETAILED DESCRIPTION OF THE PRESENT INVENTION

Figure 1:
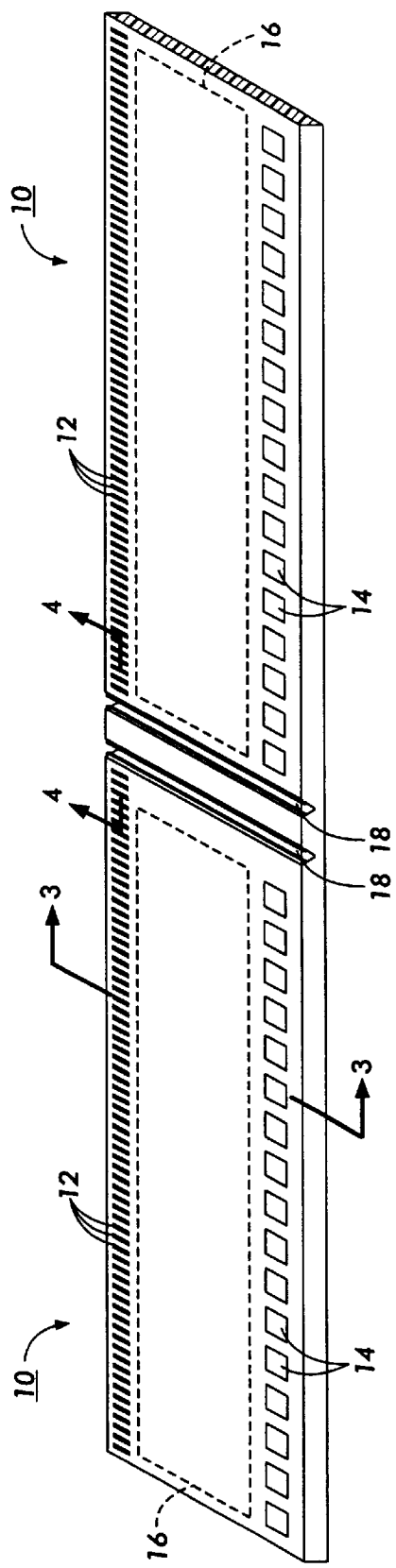
FIG. 1 is a perspective view showing two chips relevant to the present invention.

FIG. 1 is a perspective view showing two photosensitive chips 10 relevant to the claimed invention. The chips 10 are generally made of a semiconductor substrate, as is known in the art, in which circuitry and other elements are formed, such as by photolithographic etching. A few of the most relevant structures are a linear array of pixel photosites 12, each of which forms the photosensitive surface of photo-sensor circuitry within each chip 10, and a set of bonding pads 14. The pixel photosites 12 are typically arranged in a linear array along one main dimension of each chip 10, with each pixel photosite 12 along the array corresponding to one pixel in the image signal. As will be described in detail below, the pixel photosite 12 includes photosites 12B, 12G and 12R for sensing the three primary colors (blue, green and red) corresponding to the pixel.

The bonding pads 14 are distinct surfaces on the main surface of the chips 10, and are intended to accept wire bonds attached thereto. The bonding pads 14 thus serve as the electronic interface between the chips 10 and any external circuitry. The circuitry for obtaining signals related to light directed to the pixel photosites 12, and unloading image data from the chips 10 is generally indicated as 16, and is generally deposited between the linear array of pixel photosites 12 and a substantially linear array of bonding pads 14.

Figure 2:
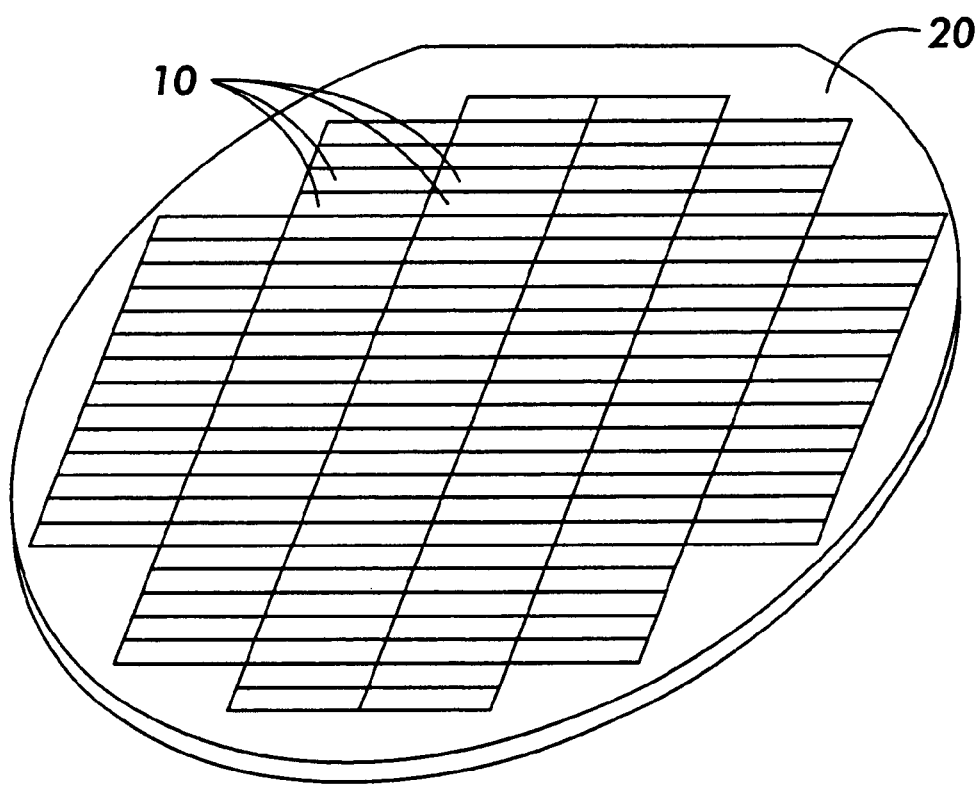
FIG. 2 is a perspective view showing a semiconductor water relevant to the present invention.

Chips 10 are typically formed in batches on semiconductor wafers, which are subsequently cleaved, or "diced," to create individual chips. Typically, the semiconductor wafers are made of silicon. As is known in the art, photolithographically-etched V-grooves 18 define precisely the intended boundaries of a particular chip 10 for dicing. Thus, all of the pixel photosites 12, bonding pads 14 and circuitry 16 for relatively large number of chips 10 are etched simultaneously onto a single semiconductor wafer 20 as shown in FIG. 2. The region between the V-grooves 18 is called the tab region. The pixel photosite 12 adjacent to each V-groove is referred to as an outer pixel photosite $12_o$. Each outer pixel photosite $12_o$ consists of three outer photosites 12B, 12G, and 12R. The other pixel photosites 12 are referred to as inner pixel photosites $12_I$ and each inner pixel photosite $12_I$ consists of three inner photosites 12B, 12G, and 12R.

FIG. 2 shows a typical semiconductor wafer 20, in isolation, wherein a relatively large number of chips 10 are created in the wafer 20 prior to dicing thereof. Each individual chip 10 has a distinct chip area within the main surface of the wafer 20. The phrase "chip area" refers to a defined area within the main surface of the wafer 20 which is intended to comprise a discrete chip 10 after the dicing step, when individual chips 10 are separated from the rest of the wafer 20.

Figure 3:
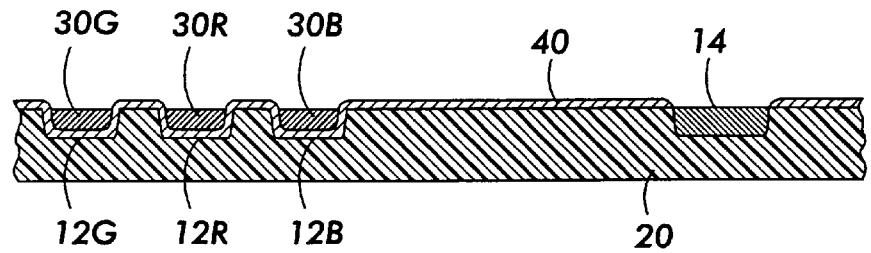
FIG. 3 is a cross-sectional view through line 3—3 in the direction of the arrows in FIG. 1, showing polyamide or acrylic layers deposited on a section of the semiconductor wafer in accordance with the prior art.

FIG. 3 is a cross sectional view through line 3—3 in the direction of the arrows of FIG. 1. On the main surface of chip 10 there is provided an inner pixel photosite $12_I$ with three separate photosites 12B, 12G and 12R, each sensitive to one primary color. As shown in the FIG. 3, within each inner pixel photosite $12_I$ is deposited a photosite 12G, sensitive to green light, a photosite 12R sensitive to red light, and a photosite 12B, sensitive to blue light. The three photosites 12B, 12G and 12R are on the whole identical as circuit elements except that the surface of each photosite 12B, 12G and 12R is superimposed thereon by a distinct primary-color filter 30. The blue filter layer, the green filter layer and the red filter layer are indicated by reference numerals 30B, 30G, and 30R.

Figure 4:
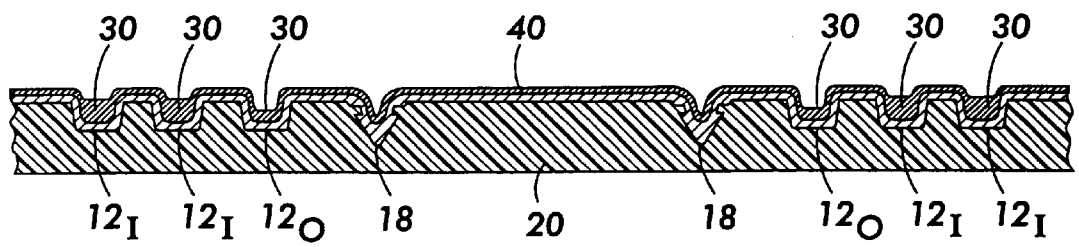
FIG. 4 is a partial cross-sectional view through line 4—4 in the direction of the arrows in FIG. 1, showing polyimide or acrylic layers deposited on a section of the semiconductor wafer in accordance with the prior art.

As is known in the art, such filters preferably comprise a polyimide or acrylic which has been doped with a commercially-available dye or pigment blended to yield a primary color filter. As is further known in the art, it is common to provide filters such as 30B, 30G and 30R, by first placing a polyimide or acrylic in liquid form over the entire main surface of the chip 10, and then removing the polyimide or acrylic by photolithography in all areas of the chip 10 except where the filter area is desired. To ensure a uniform coating of these materials, the semiconductor wafer 20 is partially planarized by using clear layer 40, which is preferably a clear polyimide or clear acrylic layer. This clear layer 40 acts to smoothen the topography of the semiconductor wafer 20 and partially fill the V-grooves 18 as shown in FIG. 4. Since the clear layer 40 only partially planarizes the semiconductor wafer 20, the V-grooves 18 still allow some of the filter material to be channeled away from the outer pixel photosites $12_o$, causing thinning of the filter material over the outer pixel photosites $12_o$ as shown in FIG. 4. The outer pixel photosites 12 on the semiconductor wafer 20 have substantially thinner filter layers 30 than the inner photosite pixels $12_I$ due to the chip topography of the semiconductor wafer 20 as explained above. The two embodiments of the present invention enhance the image sensing capability of the photosensitive chips 10 by increasing the thickness of the filter layers of the outer pixel photosites $12_o$.

Figure 5:
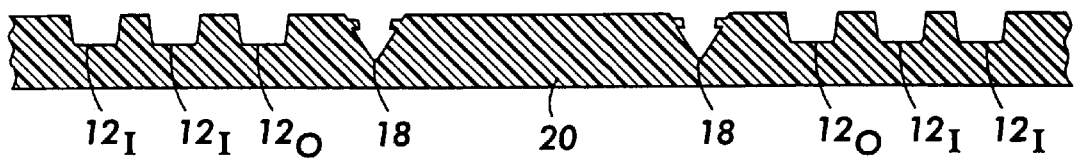
FIG. 5 is a partial cross-sectional view through line 4—4 in the direction of the arrows in FIG. 1, showing a section of the semiconductor wafer before a clear layer is deposited in accordance with the embodiments of the present invention.
Figure 6:
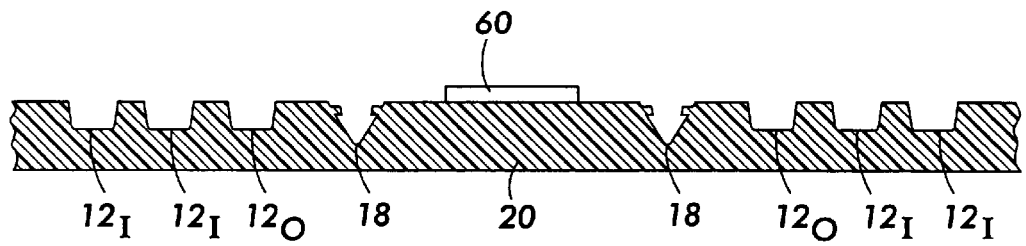
FIG. 6 shows a section of the semiconductor wafer of FIG. 5 on which a dam is deposited in a tab region in accordance with a first embodiment of the present invention.
Figure 8:
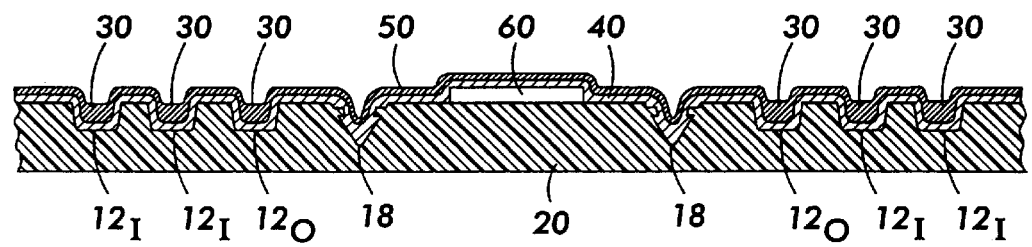
FIG. 8 shows a filter layer deposited on the section of the semiconductor wafer shown in FIG. 6 in accordance with the first embodiment of the present invention.

FIG. 5 is a cross-sectional view through line 4—4 in the direction of the arrows in FIG. 1, showing a section of the semiconductor wafer 20 before the acrylic or polyimide layers are deposited in accordance with the first embodiment of the present invention. Then, an aluminum, polyimide or acrylic dam 60 is deposited on at least one tab region as shown in FIG. 6. Preferably, a dam 60 is deposited in each tab region between the chips 10 on the semiconductor wafer 20. A clear layer 40, which is preferably polyimide or acrylic, is deposited on the semiconductor wafer 20 including the dam 60 to smooth the topography of the semiconductor wafer 20. The coated semiconductor wafer 20 is soft baked (partially baked), and certain areas of the semiconductor wafer 20 are selected for exposure to ultraviolet light using a mask. The clear layer 40 is etched out of the bonding pads 14. An etched out bonding pad 14 is shown in prior art FIG. 3. According to the first embodiment of the present invention, the semiconductor wafer 20 is then hard baked. A filter layer 30 is deposited on the semiconductor wafer 20 as shown in FIG. 8. By forming dams 60 in the tab regions, the outer pixel photosites $12_o$ now have a deeper well to collect additional filter material so that there is a thicker filter layer 30 in the outer pixel photosites $12_o$ as indicated in FIG. 8. The other filter layers 30 are deposited on the semiconductor wafer 20 in a similar manner. This enhances the image sensing capability of the photosensitive chips 10.

If only one filter layer 30 was to be deposited on semiconductor wafer 20, then the semiconductor wafer 20 would be soft baked. Then, certain areas of the semiconductor wafer 20 would be selectively exposed to ultraviolet light using a mask and the filter layer 30 would be etched out of the semiconductor wafer 20 except for the pixel photosites 12. The semiconductor wafer 20 would then be hard baked and diced to provide chips 10.

Figure 7:
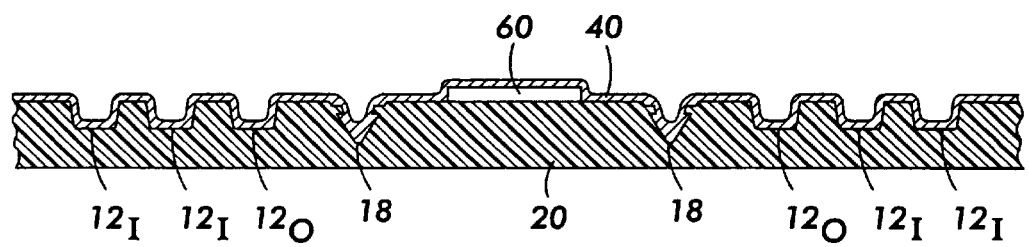
FIG. 7 shows a clear layer deposited on the section of the semiconductor wafer shown in FIG. 6 in accordance with the first embodiment.

However, two additional filter layers 30 are preferably added to semiconductor wafer 20. Therefore, after the first filter layer 30 is deposited on the semiconductor wafer 20, the semiconductor wafer 20 is soft baked. Certain areas of the semiconductor wafer 20 are selected for exposure to ultraviolet light using a mask. Preferably, the filter layer 30 is etched out of the semiconductor wafer 20 except for one row of photosites in each chip area, which is shown by the partial cross section of chips 10 in FIG. 8. The two other rows of photosites in each chip area have substantially the same configuration as shown in the partial cross section of chips 10 in FIG. 7. A second filter layer 30 is deposited on the semiconductor wafer 20, and these two rows now have substantially the same configuration as shown in FIG. 8. The semiconductor wafer 20 is then soft baked, selectively exposed to ultraviolet light, selectively etched and hard baked so that two rows of photosites in each chip area each have a different filter layer 30. The two rows having filter layers 30 in each chip area have substantially the same configuration as shown by the partial cross section in FIG. 8. The last row of photosites, which does not have a filter layer 30, has substantially the same configuration as shown in the partial cross section in FIG. 7.

A third filter layer 30 is deposited on the semiconductor wafer 20. The semiconductor wafer 20 is then soft baked, selectively exposed to ultraviolet light, selectively etched and hard baked so that three rows of photosites now have substantially the same configuration as shown in FIG. 8. However, each filter layer 30 preferably has a different filter material. Preferably, the three filter layers 30 are red, green and blue.

Figure 9:
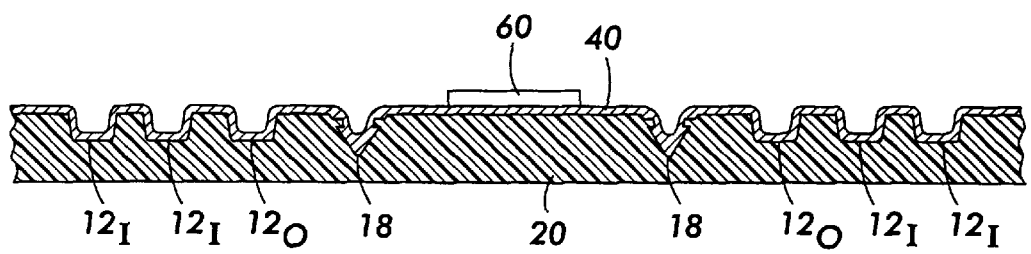
FIG. 9 shows a clear layer deposited on a section of the semiconductor wafer and a dam formed in a tab region on the clear layer according to a second embodiment of the present invention.
Figure 10:
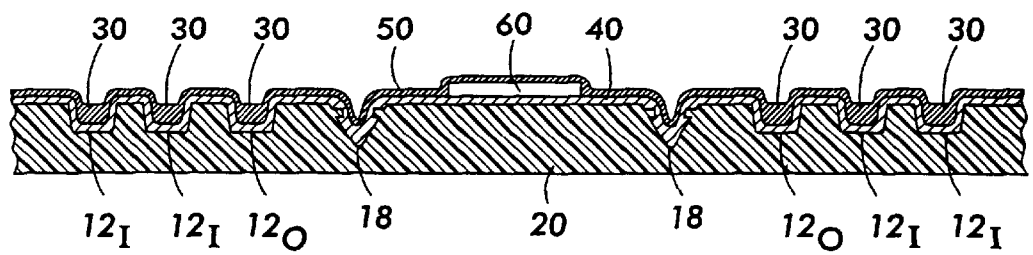
FIG. 10 shows a filter layer deposited on the section of the semiconductor wafer shown in FIG. 9 according to the second embodiment of the present invention.

In the second embodiment of the present invention, a clear layer 40 is deposited on the semiconductor wafer 20. The coated semiconductor wafer 20 is soft baked (partially baked), and certain areas of the semiconductor wafer 20 are selected for exposure to ultraviolet light using a mask. The clear layer 40 is etched out of the bonding pads 14. An etched out bonding pad is shown in FIG. 3. Then, at least one aluminum, polyimide or acrylic dam 60 is deposited in the tab region and on the clear layer 40 as shown in FIG. 9. Preferably, a dam 60 is deposited in each tab region between the chips 10 on the clear layer 40 of the semiconductor wafer 20. According to the second embodiment of. the present invention, the semiconductor wafer 20 is then hard baked. A filter layer 30 is deposited on the semiconductor wafer 20 as shown in FIG. 10. By forming dams 60 in the tab regions, the outer pixel photosites $12_o$ now have a deeper well to collect additional filter material so that there is a thicker filter layer 30 in the outer pixel photosites $12_o$ as indicated in FIG. 10. The other filter layers 30 are deposited on the semiconductor wafer 20 in a similar manner. This enhances the image sensing capability of the photosensitive chips 10.

If only one filter layer 30 was to be deposited on semiconductor wafer 20, then the semiconductor wafer 20 would be soft baked. Then, certain areas of the semiconductor wafer 20 would be selectively exposed to ultraviolet light using a mask and the filter layer 30 would be etched out of the semiconductor wafer 20 except for the pixel photosites 12. The semiconductor wafer 20 would then be hard baked and diced to provide chips 10.

However, two additional filter layers 30 are preferably added to semiconductor wafer 20. Therefore, after the first filter layer 30 is deposited on the semiconductor wafer 20, the semiconductor wafer 20 is soft baked. Certain areas of the semiconductor wafer 20 are selected for exposure to ultraviolet light using a mask. Preferably, the filter layer 30 is etched out of the semiconductor wafer 20 except for one row of photosites in each chip area, which is shown by the partial cross section of chips 10 in FIG. 10. The two other rows of photosites in each chip area have substantially the same configuration as shown in the partial cross section of chips 10 in FIG. 9. A second filter layer 30 is deposited on the semiconductor wafer 20, and these two rows now have substantially the same configuration as shown in FIG. 10. The semiconductor wafer 20 is then soft baked, selectively exposed to ultraviolet light, selectively etched and hard baked so that two rows of photosites in each chip area each have a different filter layer 30. The two rows having filter layers 30 in each chip area have substantially the same configuration as shown in the partial cross section in FIG. 10. The last row of photosites, which does not have a filter layer 30, is shown by the partial cross section in FIG. 9.

A third filter layer 30 is deposited on the semiconductor wafer 20. a The semiconductor water 20 is then soft baked, selectively exposed to ultraviolet light, selectively etched and hard baked so that three rows of photosites now have substantially the same configuration as shown in FIG. 10. However, each filter layer 30 preferably has a different filter material. Preferably, the three filter layers 30 are red, green and blue.

Figure 11:
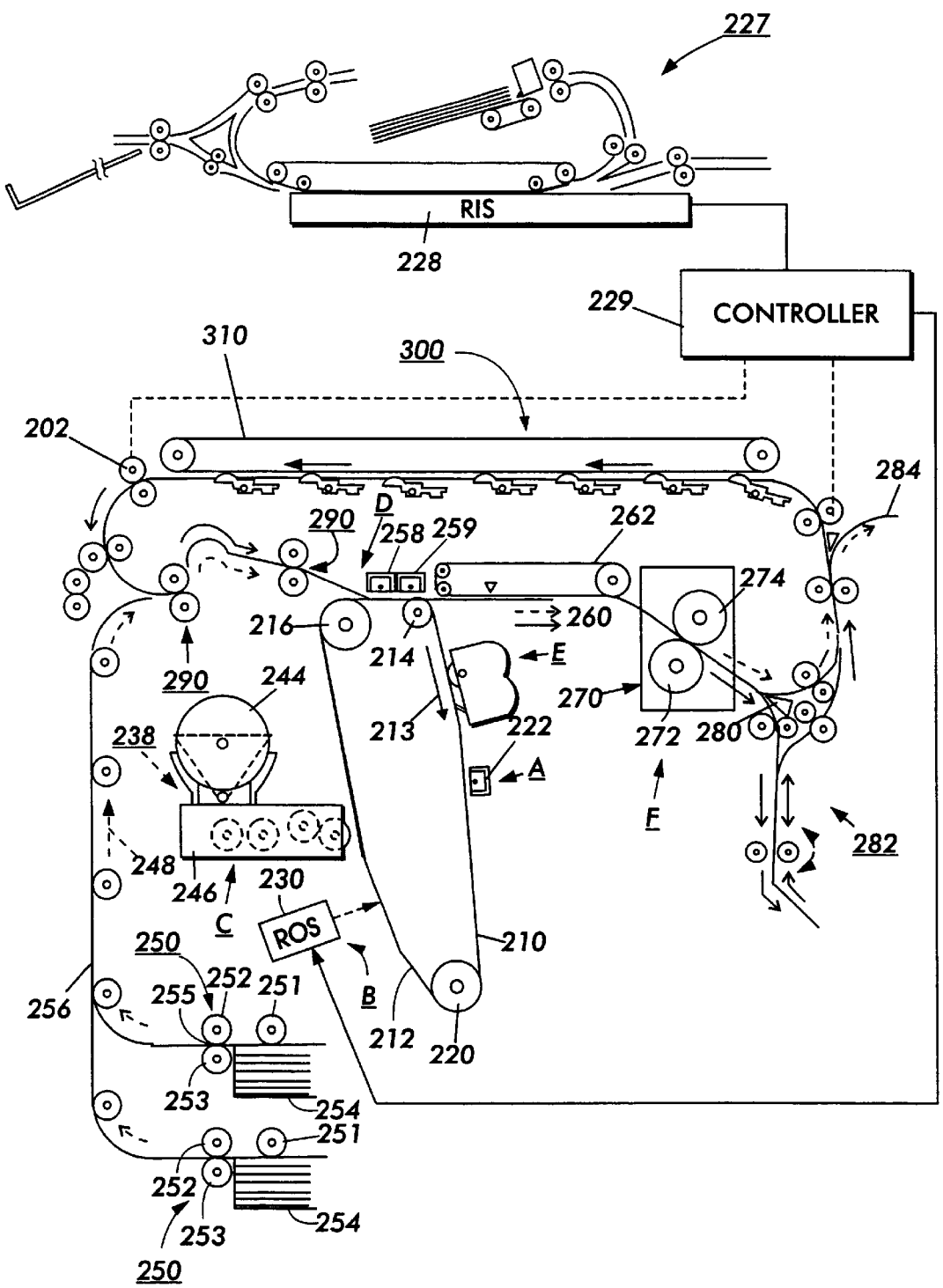
FIG. 11 is a partial schematic elevational view of an example of a digital copier, which employs the photosensitive chips of the present invention.

FIG. 11 is a partial schematic elevational view of a digital copier, which can utilize photosensitive chips 10 of the present invention by assembling them in generally the same manner as in U.S. Pat. No. 5,153,421. However, it is understood that the photosensitive chips 10 may be used together in a full width array or independently in a single chip application in any imaging or scanning device.

An original document is positioned in a document handler 227 on a raster-input scanner (RIS) indicated generally by reference numeral 228. The RIS contains document illumination lamps, optics, a mechanical scanning device and a plurality of photosensitive chips 10 as shown in FIG. 1. The photosensitive chips 10 may include any one of the photosensitive arrays described above. The RIS captures the entire original document and converts it to a series of raster scan lines. This information is transmitted to an electronic subsystem (ESS) which controls a raster output scanner (ROS).

The digital copier employs a photoconductive belt 210. Preferably, the photoconductive belt 210 is made from a photoconductive material coated on a ground layer, which, in turn, is coated on an anti-curl backing layer. Belt 210 moves in the direction of arrow 213 to advance successive portions sequentially through the various processing stations deposited about the path of movement thereof. Belt 210 is entrained about stripping roller 214, tensioning roller 220 and drive roller 216. As roller 216 rotates, it advances belt 210 in the direction of arrow 213.

Initially, a portion of the photoconductive surface passes through charging station A. At charging station A, a corona generating device indicated generally by the reference numeral 222 charges the photoconductive belt 210 to a relatively high, substantially uniform potential.

At an exposure station B, a controller or electronic subsystem (ESS), indicated generally by reference numeral 229, receives the image signals representing the desired output image and processes these signals to convert them to a continuous tone or grayscale rendition of the image which is transmitted to a modulated output generator, for example the raster output scanner (ROS), indicated generally by reference numeral 230. Preferably, ESS 229 is a self-contained, dedicated minicomputer. The image signals transmitted to ESS 229 may originate from a RIS 228 as described above or another type of scanner utilizing the photosensitive chips 10, thereby enabling the digital copier to serve as a remotely located printer for one or more scanners. Alternatively, the printer may serve as a dedicated printer for a high-speed computer or for one or more personal computers. The signals from ESS 229, corresponding to the continuous tone image desired to be reproduced by the printer, are transmitted to ROS 230. ROS 230 includes a laser with rotating polygon mirror blocks. The ROS 230 will expose the photoconductive belt 210 to record an electrostatic latent image thereon corresponding to the continuous tone image received from ESS 229. As an alternative, ROS 230 may employ a photosensitive array of light emitting diodes (LEDs) arranged to illuminate the charged portion of photoconductive belt 210 on a raster-by-raster basis.

After the electrostatic latent image has been recorded on photoconductive surface 212, belt 210 advances the latent image to a development station, C, where toner, in the form of liquid or dry particles, is electrostatically attracted to the latent image using commonly known techniques. The latent image attracts toner particles from the carrier granules forming a toner powder image thereon. As successive electrostatic latent images are developed, toner particles are depleted from the developer material. A toner particle dispenser, indicated generally by the reference numeral 244, dispenses toner particles into developer housing 246 of developer unit 238.

With continued reference to FIG. 11, after the electrostatic latent image is developed, the toner powder image present on belt 210 advances to transfer station D. A print sheet 248 is advanced to the transfer station, D, by a sheet feeding apparatus, 250. Preferably, sheet feeding apparatus 250 includes a nudger roll 251 which feeds the uppermost sheet of stack 254 to nip 255 formed by feed roll 252 and retard roll 253. Feed roll 252 rotates to advance the sheet from stack 254 into vertical transport 256. Vertical transport 256 directs the advancing sheet 248 of support material into the registration transport 290 and past image transfer station D to receive an image from photoreceptor belt 210 in a timed sequence so that the toner powder image formed thereon contacts the advancing sheet 248 at transfer station D. Transfer station D includes a corona generating device 258, which sprays ions onto the back side of sheet 248. This attracts the toner powder image from photoconductive surface 212 to sheet 248. The sheet is then detached from the photoreceptor by corona generating device 259 which sprays oppositely charged ions onto the back side of sheet 248 to assist in removing the sheet from the photoreceptor. After transfer, sheet 248 continues to move in the direction of arrow 260 by way of belt transport 262 which advances sheet 248 to fusing station F.

Fusing station F includes a fuser assembly indicated generally by the reference numeral 270 which permanently affixes the transferred toner powder image to the copy sheet. Preferably, fuser assembly 270 includes a heated fuser roller 272 and a pressure roller 274 with the powder image on the copy sheet contacting fuser roller 272. The pressure roller 274 is loaded against the fuser roller 272 to provide the necessary pressure to fix the toner powder image to the copy sheet. The fuser roller 272 is internally heated by a quartz lamp (not shown). Release agent, stored in a reservoir (not shown), is pumped to a metering roll (not shown). A trim blade (not shown) trims off the excess release agent. The release agent transfers to a donor roll (not shown) and then to the fuser roll 272. Or alternatively, release agent is stored in a presoaked web (not shown) and applied to the fuser roll 272 by pressing the web against fuser roll 272 and advancing the web at a slow speed.

The sheet then passes through fuser 270 where the image is permanently fixed or fused to the sheet. After passing through fuser 270, a gate 280 either allows the sheet to move directly via output 284 to a finisher or stacker, or deflects the sheet into the duplex path 300, specifically, first into single sheet inverter 282 here. That is, if the sheet is either a simplex sheet, or a completed duplex sheet having both side one and side two images formed thereon, the sheet will be conveyed via gate 280 directly to output 284. However, if the sheet is being duplexed and is then only printed with a side one image, the gate 280 will be positioned to deflect that sheet into the inverter 282 and into the duplex loop path 300, where that sheet will be inverted and then fed to acceleration nip 202 and belt transports 310, for recirculation back through transfer station D and fuser 270 for receiving and permanently fixing the side two image to the backside of that duplex sheet, before it exits via exit path 284.

After the print sheet is separated from photoconductive surface 212 of belt 210, the residual toner/developer and paper fiber particles adhering to photoconductive surface 212 are removed therefrom at cleaning station E. Cleaning station E includes a rotatably mounted fibrous brush in contact with photoconductive surface 212 to disturb and remove paper fibers and a cleaning blade to remove the nontransferred toner particles. The blade may be configured in either a wiper or doctor position depending on the application. Subsequent to cleaning, a discharge lamp (not shown) floods photoconductive surface 212 with light to dissipate any residual electrostatic charge remaining thereon prior to the charging thereof for the next successive imaging cycle.

Controller 229 regulates the various printer functions. The controller 229 is preferably a programmable microprocessor which controls all of the printer functions hereinbefore described. The controller 229 provides a comparison count of the copy sheets, the number of documents being recirculated, the number of copy sheets selected by the operator, time delays, jam corrections, etc. The control of all of the exemplary systems heretofore described may be accomplished by conventional control switch inputs from the printing machine consoles selected by the operator. Conventional sheet path sensors or switches may be utilized to keep track of the position of the document and the copy sheets.

While the invention has been described in detail with reference to specific and preferred embodiments, it will be appreciated that various modifications and variations will be apparent to the artisan. All such modifications and embodiments as may occur to one skilled in the art are intended to be within the scope of the appended claims.

We claim:

1. A method for fabricating at least one semiconductor chip for a digital copier comprising:

providing a semiconductor wafer having a main surface defining chip areas separated by grooves, the chip areas defining bonding pads and three rows of photosites, wherein the photosites include inner photosites, outer photosites and bonding pads;

(a) depositing dams in tab regions on the semiconductor wafer;

(b) hard baking the semiconductor wafer;

(c) depositing a clear layer on the semiconductor wafer;

(d) soft baking the semiconductor wafer;

(e) exposing selective areas of a semiconductor wafer; etching the clear layer covering the bonding pads from the semiconductor wafer;

(f) hard baking the semiconductor wafer; and (g) depositing a first primary color filter layer over at least first inner photosite and first outer photosite, the first primary color filter transmitting a primary color.

2. The method for fabricating at least one semiconductor chip for a digital copier as in claim 1, further comprising dicing the semiconductor wafer to produce the semiconductor chip.

3. A method for fabricating at least one semiconductor chip for a digital copier comprising:

providing a semiconductor wafer having a main surface defining chip areas separated by grooves, the chip areas defining bonding pads and three rows of photosites, wherein the photosites include inner photosites, outer photosites and bonding pads;

(a) depositing clear layer on the semiconductor wafer;

(b) soft baking the semiconductor wafer;

(c) exposing selective areas of a semiconductor wafer;

(d) etching the clear layer covering the bonding pads from the semiconductor wafer;

(e) hard baking the semiconductor wafer;

(f) depositing dams in tab regions on the semiconductor wafer;

(g) hard baking the semiconductor wafer; and (h) depositing a first primary color filter layer over at least first inner photosite and first outer photosite, the first primary color filter layer transmitting a primary color.

4. The method for fabricating the at least one semiconductor chip for a digital copier as in claim 3, further comprising dicing the semiconductor wafer to produce the semiconductor chip.

* * * * *